(12) United States Patent
Lai et al.

(10) Patent No.: US 9,672,907 B2
(45) Date of Patent: Jun. 6, 2017

(54) CONTROLLING BOTH CURRENT AND VOLTAGE OF RESISTIVE RANDOM ACCESS MEMORY DEVICE

(71) Applicant: Brocere Electronics company limited, New Taipei (TW)

(72) Inventors: Chih-Hao Lai, Taipei (TW); Chih-Kai Huang, Taipei (TW); Jou-Hung Wang, New Taipei (TW)

(73) Assignee: Brocere Electronics company limited, New Taipei (TW)

(*) Notice: Subject to any disclaimer, the term of this patent is extended or adjusted under 35 U.S.C. 154(b) by 193 days.

(21) Appl. No.: 14/606,033

(22) Filed: Jan. 27, 2015

(65) Prior Publication Data
US 2016/0217851 A1 Jul. 28, 2016

(51) Int. Cl.
*G11C 13/00* (2006.01)
*G11C 11/14* (2006.01)

(52) U.S. Cl.
CPC ........ *G11C 13/004* (2013.01); *G11C 13/0069* (2013.01); *G11C 2013/009* (2013.01); *G11C 2013/0045* (2013.01); *G11C 2013/0078* (2013.01); *G11C 2213/77* (2013.01)

(58) Field of Classification Search
CPC .............. G11C 13/004; G11C 13/0004; G11C 11/1659; G11C 11/1675; G11C 13/0002; G11C 13/0011; G11C 13/0021; G11C 13/0069; G11C 2213/79; G11C 7/22; G11C 8/08; G11C 13/0026; G11C 2013/0083;

(Continued)

(56) References Cited

U.S. PATENT DOCUMENTS 6,801,448 B2 10/2004 Hsu
6,967,884 B2 11/2005 Hsu
7,236,389 B2 6/2007 Hsu
(Continued)

FOREIGN PATENT DOCUMENTS

CN 1725369 5/2010
CN 102368536 3/2012

OTHER PUBLICATIONS

Wen Chao Shen, High-K Metal Gate Contact RRAM (CRRAM) in Pure 28nm CMOS Logic Process, Dec. 2012, p. 31.6.1-31.6.4, IEDM.

*Primary Examiner* — Hien Nguyen
(74) *Attorney, Agent, or Firm* — Winston Hsu; Scott Margo

(57) ABSTRACT

A resistive random access memory device includes: a first control line, a second control line, a RRAM cell, a first programmable current source and a first programmable voltage source. The RRAM cell is coupled between the first control line and the second control line, and has a programmable resistive element. The first programmable current source is coupled to the first control line, and for selectively providing a configuration current to the RRAM cell. The first programmable voltage source is coupled to the first control line, and for selectively providing a configuration voltage to the RRAM cell. Additionally, a state of the programmable resistive element of the RRAM cell is configured according to the configuration current and the configuration voltage. Under architecture of the RRAM cell of the present invention, a reading circuit for the RRAM device can be implemented with a simple inverter instead of a complicated current sensing amplifier.

14 Claims, 8 Drawing Sheets

(58) Field of Classification Search
CPC .............. G11C 7/12; G11C 2013/0054; G11C 2013/0078
See application file for complete search history.

(56) References Cited

U.S. PATENT DOCUMENTS

| | | |
|---|---|---|
| 8,274,812 B2 | 9/2012 | Nazarian |
| 8,391,049 B2 | 3/2013 | Jo |
| 2005/0041464 A1 | 2/2005 | Cho |
| 2013/0215669 A1* | 8/2013 | Haukness .......... G11C 13/0007 365/148 |
| 2014/0115243 A1 | 4/2014 | Lin |
| 2014/0268988 A1 | 9/2014 | Cai |
| 2015/0009745 A1* | 1/2015 | Nguyen ............... G11C 13/004 365/148 |
| 2015/0243354 A1* | 8/2015 | Bateman ............ G11C 13/0038 365/72 |

* cited by examiner

CONTROLLING BOTH CURRENT AND VOLTAGE OF RESISTIVE RANDOM ACCESS MEMORY DEVICE

BACKGROUND OF THE INVENTION

1. Field of the Invention

The present invention relates to random access memory and more particularly, to a resistive random access memory device.

2. Description of the Prior Art

Resistive random-access memory (RRAM) is a type of non-volatile memory that works by changing the resistance across a dielectric solid-state material. An RRAM cell stores information basically based on the resistance changing. The RRAM cell typically has two different resistance states, a low resistance state and a high resistance state. In the low resistance state (also referred to as a "LR" state or a "SET" state), it represents the RRAM cell stores a logic 1 while in the high resistance state (also referred to as a "HR" state or a "RESET" state), it represents the RRAM stores a logic 0. The RRAM cell changes its resistance states by a set operation and a reset operation. In the set operation, a large enough voltage is applied between terminals of the RRAM cell and a current flowing through the RRAM cell is simultaneously limited to a specific level. As a consequence, conductors in the RRAM cell would be formed shorted, such that the RRAM cell would be set to the low resistance state. In the reset operation, a large enough current is applied to flow through the RRAM cell and burned open the conductors (which are shorted in the set operation) in the RRAM cell. As a consequence the RRAM cell would be reset to HR state.

Please refer to FIG. 1, which illustrates the architecture of a conventional RRAM cell. An RRAM cell 10 includes a programmable resistor 40 having a resistance that is configurable by a signal SL on a source line 20, a signal BL on a bit line 50, and a signal WL on the word line 60. The signal WL is not only intended for bit selection, but also configure a turn-on resistance of the MOS switch 30 to control RRAM cell 10 at SET/RESET state.

Operations of the RRAM cell can reference to FIG. 2, which illustrates a relationship of a current (labeled with and hereinafter as "IR") flowing through the programmable resistor 40 (from the source line 20 to bit line 50) with respect to a voltage drop (labeled with and hereinafter as "VR") across the programmable resistor 40.

Assume RRAM cell is at low resistance state initially and BL connects to ground, when the signal SL on the source line 20 is applied to the programmable resistor 40 and increases from ground level, the current IR increases with the slope=1/(resistance at LR state) (designated with (a)) before the current IR exceeds the reset current threshold IRST. Once the current IR exceeds the reset current threshold IRST, the shorted conductors in the RRAM cell 10 would be burned opened, which changes programmable resistor 40 to HR state and current IR increases with the slope=1/(resistance at HR state) (designated with (b)).

If SL voltage is large enough to make the voltage drop VR larger than the set threshold voltage VSET of the programmable resistor 40, the conductors of programmable resistor 40 would be shorted and change to LR state. However, this high VR results a large current (designated with (c)) flowing through the LR state programmable resistor 40 and burned out the conductor again. This would force the programmable resistor back to HR state immediately and become unstable. To address this issue, the conventional RRAM cell needs one MOS switch 30 with high turn-on resistance to limit (clamp) the current level (ICLAMP) when programmable resistor 40 enter LR state during SET operation.

The above situation describe MOS switch 30 would be designed at high turn on resistance during SET mode. On the other hand, during RESET mode, MOS switch 16 should be designed low turn on resistance for larger current flowing through programmable resistor 40 and easier over IRST current. Because the MOS switch size should be fixed in RRAM cell, the turn on resistance has to be well controlled by WL voltage.

There are several drawbacks in prior art. First, to add MOS switch 30 in RRAM cell increases RRAM cell size. Second, the turn-on resistance of the MOS switch 30 need to well controlled during SET and RESET mode, however, the resistance could be varied by process variation, bias environment, and aging problem, and needs to be fine trimmed by the gate voltage of MOS switch 30 (e.g. the voltage level of the signal WL), which is not easy to be accurately controlled and needs to be calibrated chip by chip.

In light of above, it is necessary to provide a method to clamping the current flowing through the memory cell without using a MOS switch, thus addressing the above-mentioned problem.

SUMMARY OF THE INVENTION

To avoid using MOS switch, the present invention uses a programmable current source and voltage source together to configure states of the programmable resistor directly. The programmable current source can limit the current passing through the programmable resistor during SET mode and can drive large current during RESET mode. With such architecture, circuits for reading the bit information can also be significantly simplified. In FIG. 5, it shows the voltage source and current source are common used in source line and bit line with decoder selection and may save much area in RRAM array.

According to one embodiment of the present invention, a resistive random access memory (RRAM) device is provided. The RRAM device includes: a first control line, a second control line, a RRAM cell, a first programmable current source and a first programmable voltage source. The RRAM cell is coupled between the first control line and the second control line, and has a programmable resistive element. The first programmable current source is coupled to the first control line, and employed for selectively providing a configuration current to the RRAM cell. The first programmable voltage source is coupled to the first control line, and employed for selectively providing a configuration voltage to the RRAM cell. Additionally, a state of the programmable resistive element of the RRAM cell is configured according to the configuration current and the configuration voltage.

According to one embodiment of the present invention, a resistive random access memory (RRAM) device with a reading circuit is provided. The RRAM device includes: a first control line; a second control line; a RRAM cell, coupled between the first control line and the second control line, having a programmable resistive element; a programmable current source, coupled to the first control line, for selectively providing a configuration current to the RRAM cell; and a reading circuit, coupled to the first control line, for selectively reading a voltage across the programmable resistive element. Additionally, when the reading circuit reads the voltage, the configuration current is configured at VDD/HSR, wherein VDD is an operating voltage of the RRAM device and HSR is a resistance of the programmable resistive element.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
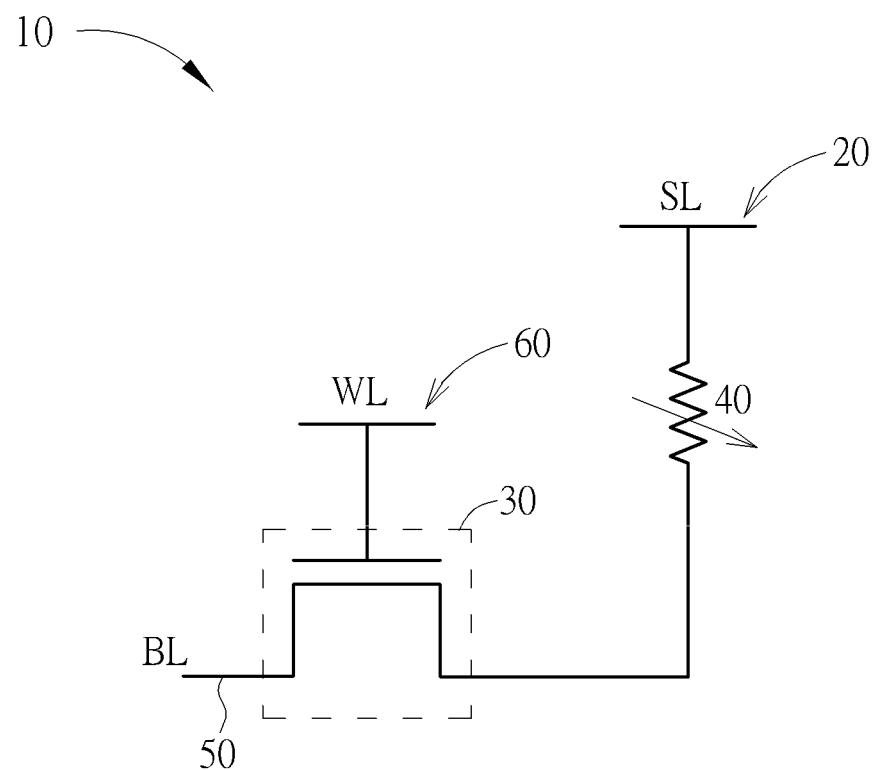
FIG. 1 illustrates a conventional RRAM cell with a MOS switch for current clamping.
Figure 2:
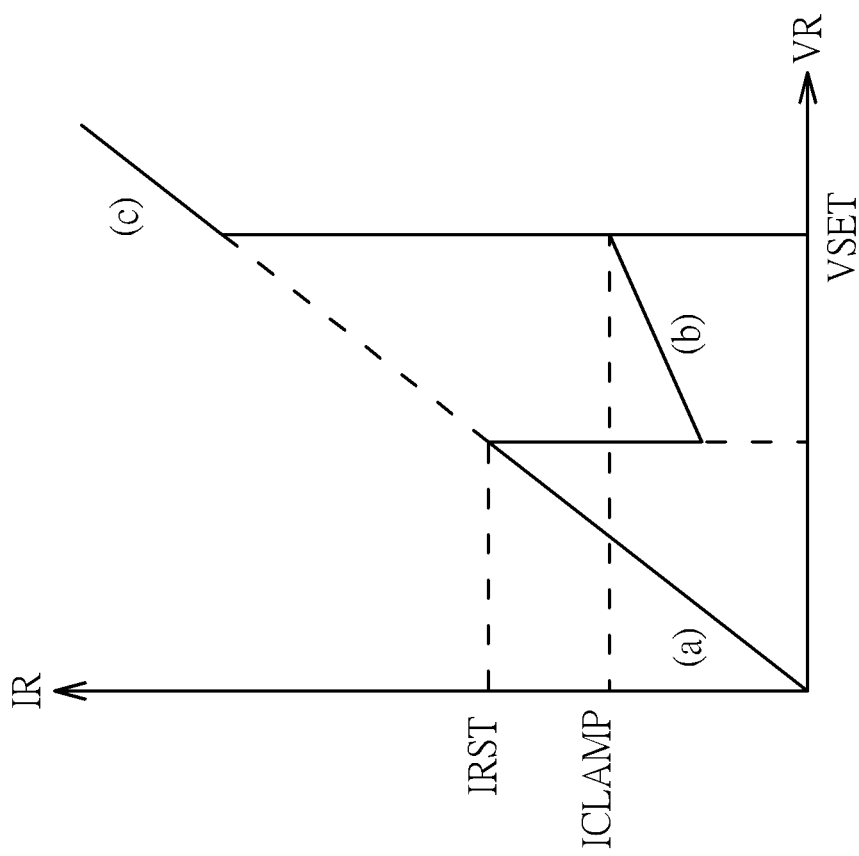
FIG. 2 illustrates a relationship of a current flowing through the programmable resistor with respect to a voltage drop across the programmable resistor in a RRAM cell.
Figure 3A:
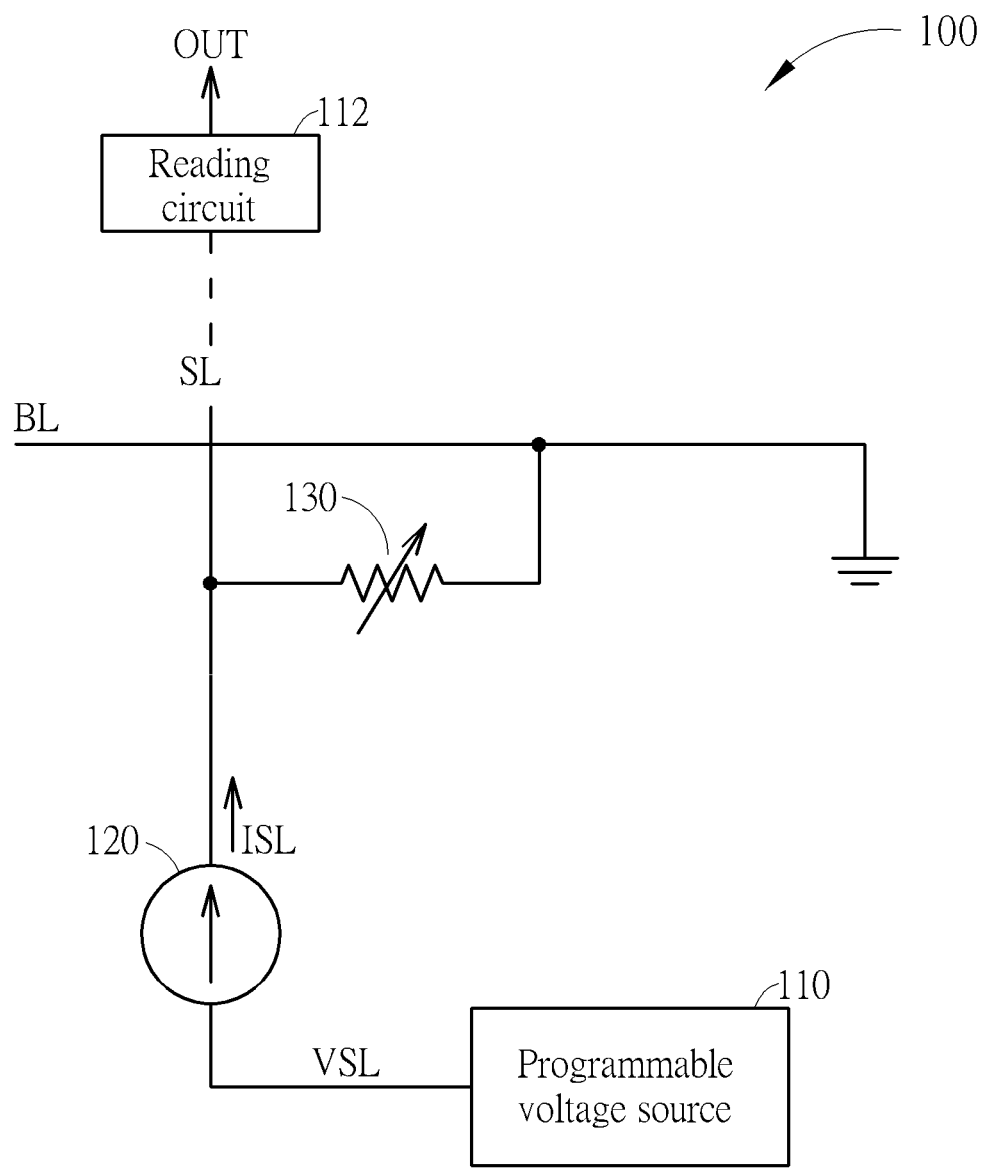
FIGS. 3A-3C illustrates 3 embodiments of RRAM cell in the present invention.

RRAM Cell:

FIG. 3A illustrates a circuit diagram of a RRAM cell of the present invention according to one embodiment of the present invention. As shown by FIG. 3A, an RRAM cell includes (but not limited to) a programmable resistor 130. The programmable resistor 130 is configurable by a combination of multiple levels of the programmable voltage source 110 (VSL) and a combination of multiple levels of the programmable current source 120 (ISL), to enter either a low resistance (LR) state or a high resistance (HR) state. The programmable voltage source 110 provides a configuration voltage VSL to a source line SL which is coupled to the programmable resistor 130. Also, the programmable current source 120 provides a configuration current ISL to the source line SL. The further details of principles and operations of the RRAM cell 100 are presented as below.

Reset Operation:

In RESET mode, the programmable voltage source 110 will configure the level of the configuration voltage VSL to be A*VSET, where VSET is a set threshold voltage of the programmable resistor 130. The factor "A" must be smaller than 1 and is recommended to 0.8. Additionally, the programmable current source 120 configures the level of the configuration current ISL to be B*IRST, where IRST is a reset threshold current of the programmable resistor 130. The factor "B" must be larger than 1 and is recommended to 1.2.

If the programmable resistor 130 has been already configured in the HR state before entering RESET mode, the programmable resistor 130 remains in HR state because the voltage drop across the programmable resistor 130 is lower than VSET by the programmable voltage source 110. As a subsequence, the programmable resistor 130 remains in the HR state.

Figure 4:
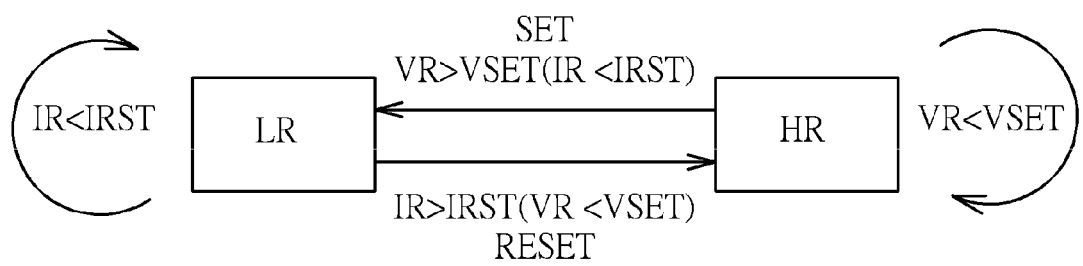
FIG. 4 illustrates a state diagram with respect to operations of the RRAM cell of the present invention.

On the other hand, if the programmable resistor 130 is previously configured in the LR state before entering RESET mode, the programmable resistor 130 will be reset to the HR state since the current flowing through the programmable resistor 130 is configured to be higher than the reset current threshold IRST. After the programmable resistor 130 has successfully been reset to the HR state, as the voltage drop is still maintained is lower than the set voltage threshold VSET, it is therefore impossible for the programmable resistor 130 to return back to the LR state. Resistances states and corresponding transition conditions are illustrated in FIG. 4 for the purpose of clarity. Furthermore, the following Table A illustrates recommended levels of the configuration voltage (VSL) and configuration current (ISL) of the programmable resistor during the reset operation.

TABLE A

| Operation | VSL | ISL |
|---|---|---|
| Set | 1.2 * VSET | 0.1 * IRST |
| Reset | 0.8 * VSET | 1.2 * IRST |
| Read | 1.2 * VDD | 1.2 * VDD/HSR |

Set Operation:

In SET mode, the programmable voltage source 110 will configure the level of the configuration voltage VSL to be C*VSET. The factor "C" must be larger than 1 and is recommended to 1.2. Additionally, the programmable current source 120 will configure the level of the current ISL to be D*IRST. The factor "D" must be much smaller than 1 and is recommended to 0.1. The above recommended configurations of VSL and ISL of the programmable resistor could be clear by referring to Table A.

If the programmable resistor 130 is previously configured in the HR state before entering SET mode, the programmable resistor 400 will be set to the LR state since the voltage drop across the programmable resistor 130 is configured to be higher than the set voltage threshold VSET. In addition, the current flowing through the programmable resistor 130 is configured to be much lower than the reset current threshold IRST to avoid the programmable resistor 130 return back to the HR state once the programmable resistor 130 is successfully reset to the LR state.

On the other hand, if the programmable resistor 130 has been already in the LR state before entering SET mode, the programmable resistor 130 remains in LR state since the current flowing through the programmable resister 130 (D*IRST) is lower than the reset current threshold IRST. Resistances states and corresponding transition conditions are illustrated in FIG. 4 for the purpose of clarity.

READ Operation:

At READ mode, the programmable voltage source 110 is configured as lower than VSET (and is recommended to 1.2*VDD) to avoid the programmable resistor 130 entering SET mode. Besides, the programmable current source 120 is configured as VDD/HSR (and is recommended to 1.2*VDD/HSR) which is much smaller than IRST to avoid the programmable resistor 130 entering RESET mode, where HSR is the resistance of the programmable resistor 130 in HR state.

When the RRAM cell 100 is in READ mode, a voltage on the source line SL can be read out by a reading circuit 112. When the programmable resistor 130 is in the HR state, the voltage on the source line SL is ISL*HSR=(VDD/HSR)*HSR, which is almost equal to VDD. On the other hand, when the programmable resistor 130 is in the LR state, the voltage on the source line SL should be ISL*LSR=(VDD/HSR)*LSR, where LSR is the resistance of the programmable resistor 130 in the LR state. Because the ratio of (LSR/HSR) is very small, this is almost equal to 0. In view of above, it is shown that the resistance states of the RRAM cell could be detected by reading SL voltage be VDD and 0. Therefore, the reading circuit 112 can be implemented by simply an inverter, which translates VDD to logic 0, and translates 0 to logic 1. Compared to the conventional art, the reading circuit 112 of the present invention is much simpler than a conventional sensing amplifier (which usually a complicated current sensing amplifier with good linearity) in circuitry complexity. Please note that even though the current provided by the programmable current source 120 is described as VDD/HSR during the read operation in the above descriptions, this is not intended to be a limitation. The configuration setting of the programmable current can be any value which can simply use simple logic circuit to distinguish the state of programmable resistor by reading the voltage level. The above recommended configurations of VSL and ISL of the programmable resistor during the read operation could be clear by referring to Table A.

Figure 3B:
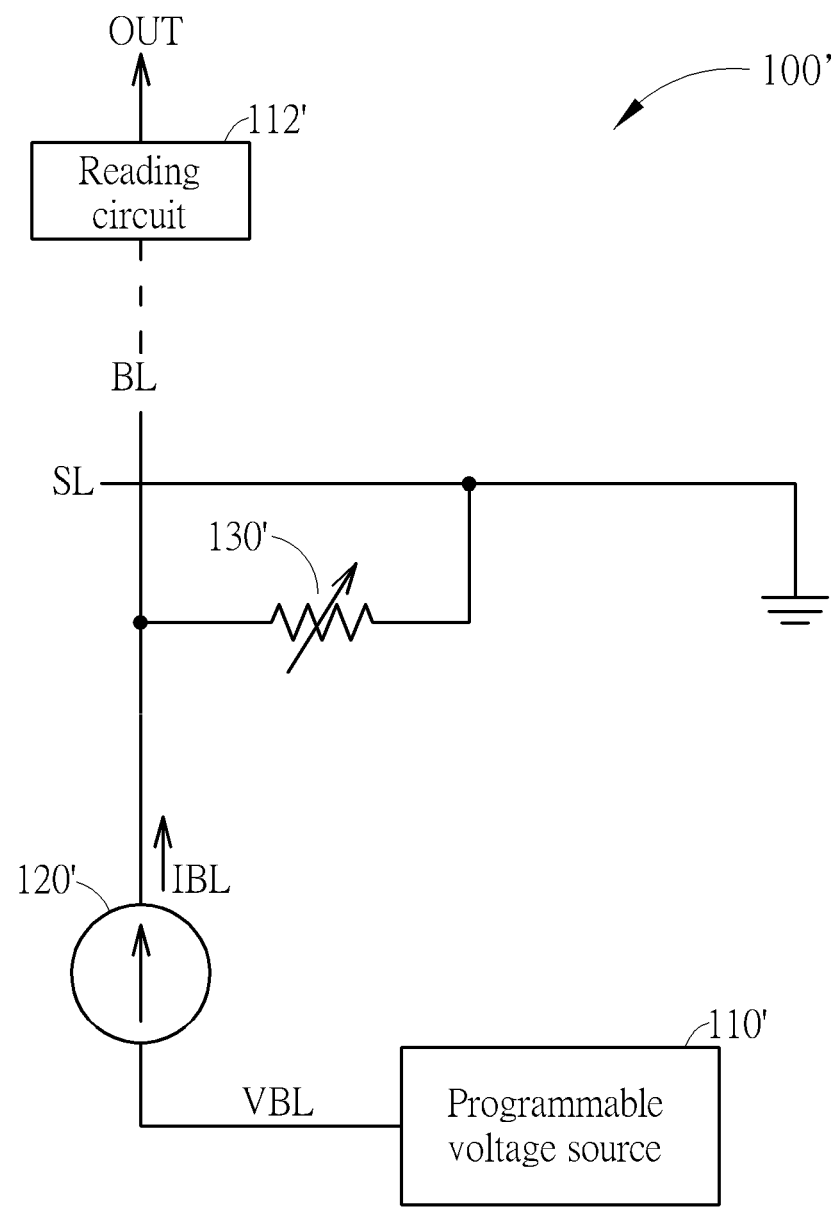
Figure 3C:
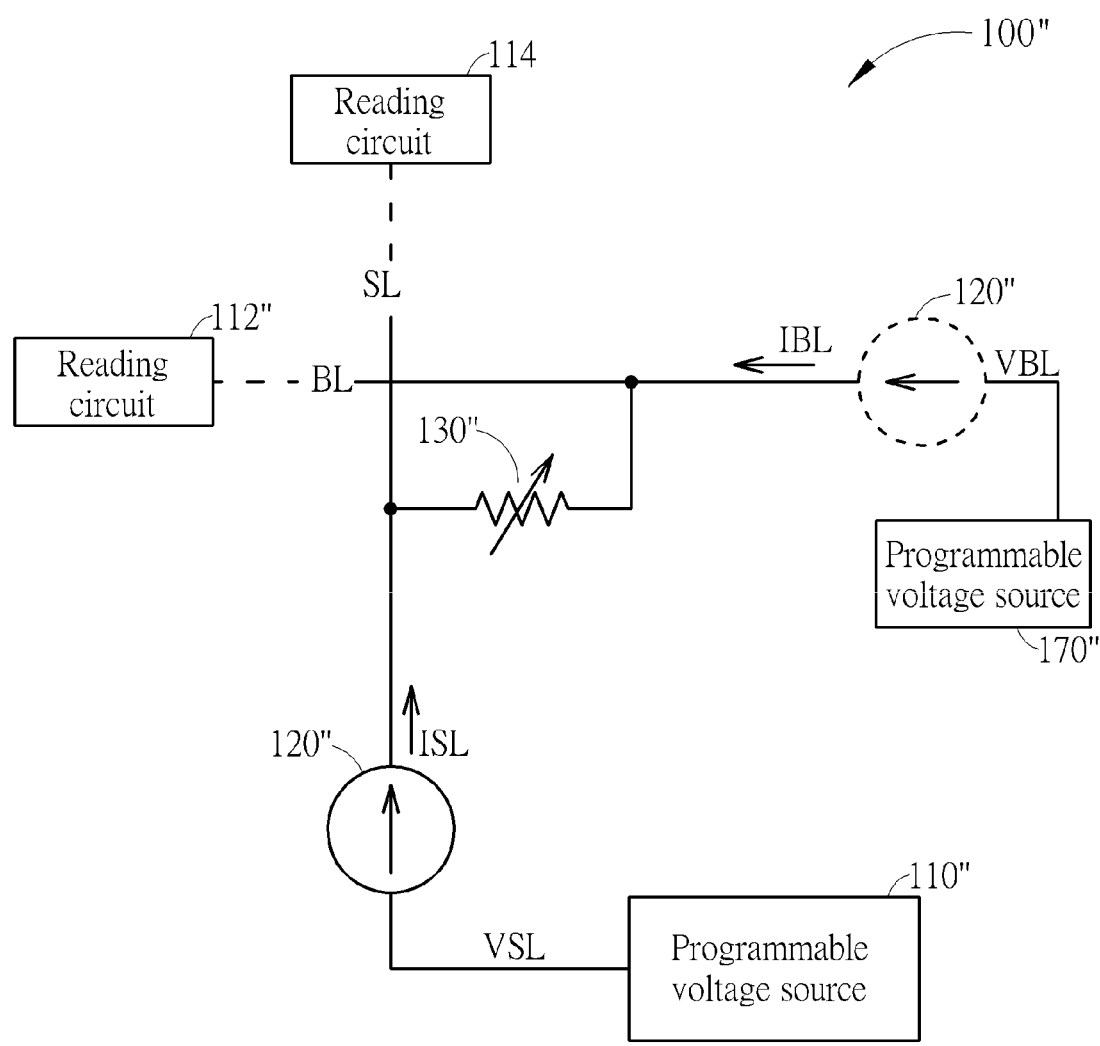

Alternative RRAM Cell:

FIG. 3B illustrates an alternative architecture of an RRAM cell 100' of the present invention according to one embodiment. Different to the embodiment shown by FIG. 3A, the programmable voltage source 110' and the programmable current source 120' are coupled to the bit line BL instead of the source line SL and the source line SL is coupled to the ground. Also, the reading circuit 112' provides the read information OUT by detecting the voltage on the bit line BL. FIG. 3C illustrates another alternative architecture of an RRAM cell 100" of the present invention according to one embodiment. Compared to the embodiment shown by FIG. 3A, the difference here is that the RRAM cell 100" are configurable by one of two sets of programmable voltage sources and the programmable current source. The programmable voltage source 110" is coupled to the programmable resistor 130" through the source line SL, while the programmable voltage source 170 is coupled to the programmable resistor 130" through the bit line BL. The programmable current source 120" is operably coupled to one of the source line SL and the bit line BL. That is, the programmable current source 120" could be either coupled between the programmable voltage source 110" and the programmable resistor 130" or coupled between the programmable voltage source 170" and the programmable resistor 130". The programmable resistor 130" is configured by the current provided by the programmable current source 120" and the voltage provided by at least one of the programmable voltage sources 110" and 170". The information stored in the programmable resistor 130" can be read from either the bit line BL or the source line SL by the reading circuit 112" or 114.

Figure 5:
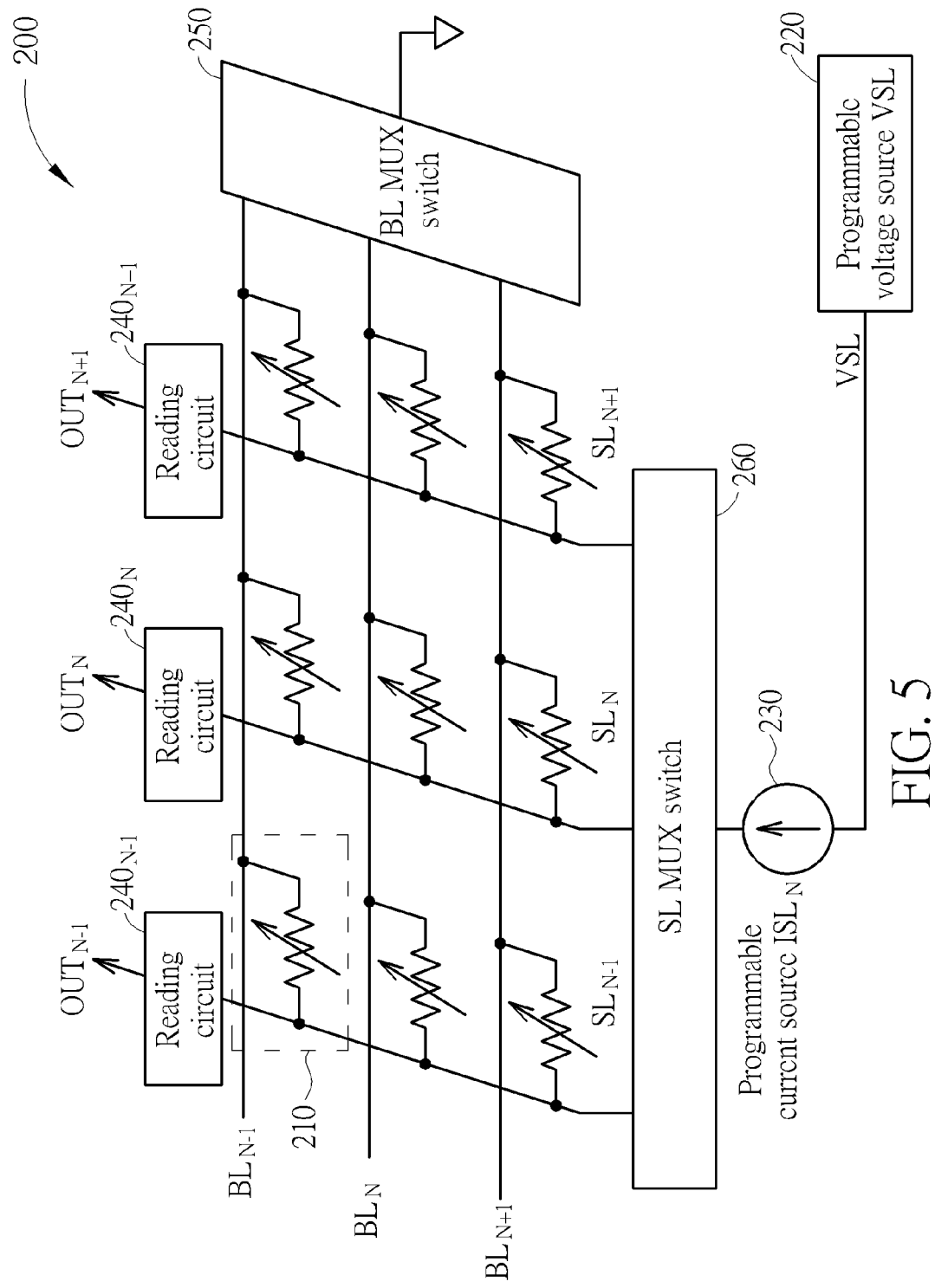
FIG. 5 illustrates a RRAM cell array according to one embodiment of the present invention.

RRAM Cell Array:

FIG. 5 illustrates an RRAM cell array 200 based on the RRAM cell 10 according to one embodiment of the present invention. When the specified RRAM cells 210 is selected, a BL MUX switch 250 will allow an end of the selected RRAM cell 210 to be connected to the ground, and a SL MUX switch 260 will allow another end of the selected RRAM cell 210 to be connected to the programmable current source 230 and the programmable voltage source 240. The programmable current source 230 and the programmable voltage source 240 provide configuration current and voltage based on the type of operations (i.e. set, reset, or read) that is applied to the selected RRAM cell 210. Reading circuits $240_{N-1}$ can read the voltage on the source line SL of the selected RRAM cell 210 to distinguish the resistance state of the RRAM cells 210 during the read operation.

Figure 6:
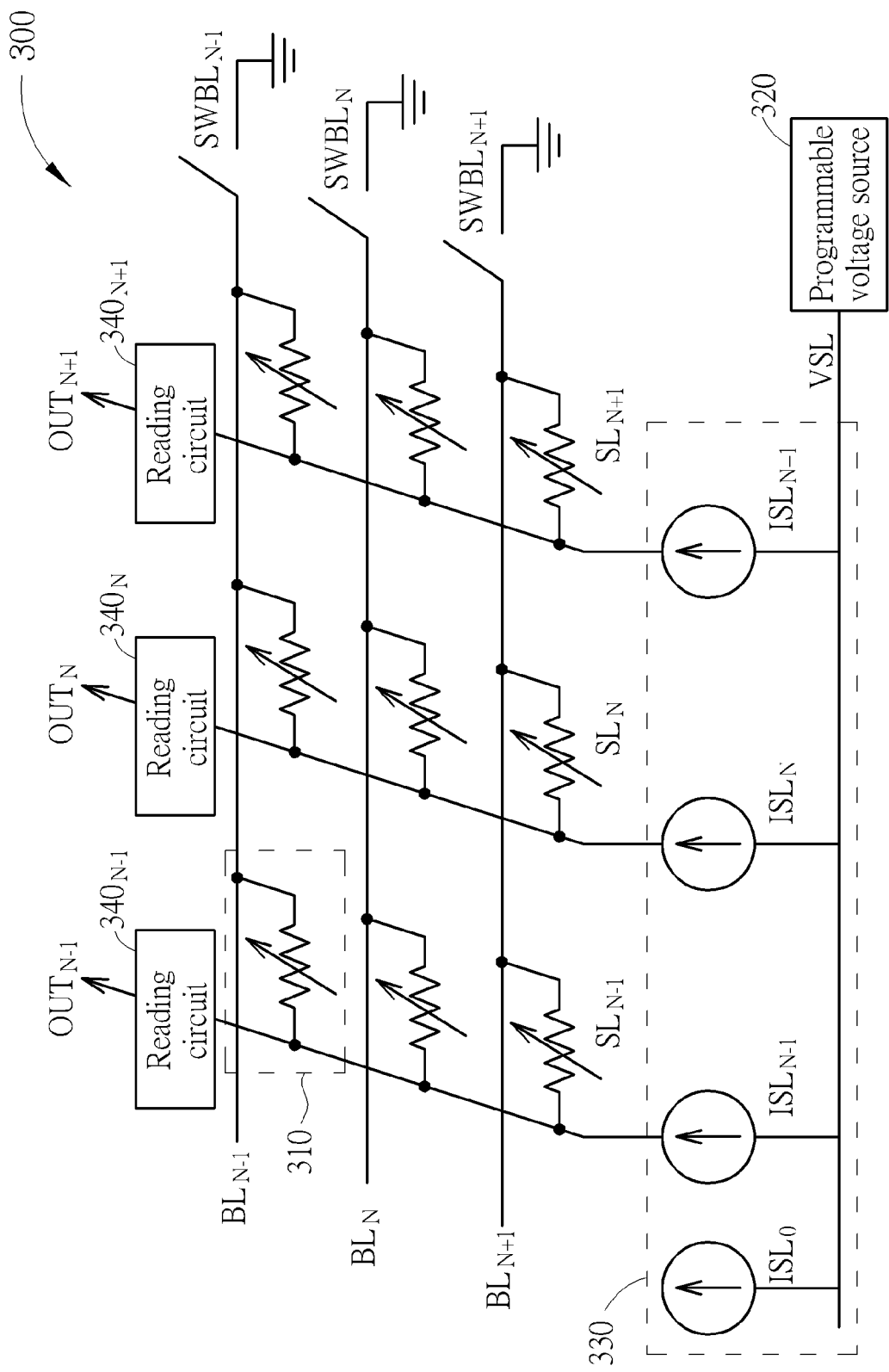
FIG. 6 illustrates a RRAM cell array according to another embodiment of the present invention.

FIG. 6 illustrates an RRAM cell array 300 based on the RRAM cell 10 according to another embodiment of the present invention. In this embodiment, cells of different columns are provided by different programmable current sources $ISL_{N-1}$-$ISL_{N+1}$. Hence, configuration currents of FIG. 6 for cells of different columns could be different and could be provided at the same time because the different programmable current source $ISL_{N-1}$-$ISL_{N+1}$ are independent. Due to independency of the current sources, cells of different columns could be operated simultaneously. For example, cells of different columns could be set, reset, or read simultaneously. Alternative, it is possible that cells of one column are being set/reset, while cells of another column are being read. This can significant improve the read/write speed of the RRAM cell array.

Please note that the above identified the RRAM cell array 200 and 300 are based on the RRAM cell 10. However, there are some modifications to the RRAM cell array 200 and 300 that are based on RRAM cells 10' and 10" according to various embodiment of the present invention. That is, there may be the RRAM cell array of the preset invention having the programmable current sources and programmable voltage source that are coupled to the programmable resistor through the bit line (which may be through the BL MUX switch). Alternatively, there may be the RRAM cell array of the preset invention having the programmable current sources and programmable voltage sources that are coupled to the programmable resistor through both the bit line and source line (through the BL MUX switch and SL MUX switch).

In conclusion, the RRAM cell of the present invention is more compact than a conventional RRAM cell which consumes larger area for well controlled turn on resistance MOS switch and the routing of word line (control gate voltage of MOS switch) bus. Without MOS switch, complicated process variation calibration/compensation algorithm is not necessary in present invention. In addition, the read operation and related circuit becomes quite simple in the present invention.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random access memory (RRAM) device, comprising:
   a first control line;
   a second control line;
   a RRAM cell, coupled between the first control line and the second control line, having a programmable resistive element, wherein the programmable resistive element has a high resistance state and a low resistance state;
   a first programmable current source, for selectively providing a configuration current to the RRAM cell; and
   a first programmable voltage source, for selectively providing a configuration voltage to the RRAM cell;
   wherein a state of the programmable resistive element of the RRAM cell is configured according to the configuration current and the configuration voltage; and the programmable resistive element is configured to the low resistance state by setting the configuration current to be lower than a reset current threshold of the programmable resistive element and setting the configuration voltage to be higher than a set voltage threshold of the programmable resistive element.

2. The RRAM device of claim 1, wherein the programmable resistive element has a first terminal coupled to the first control line and a second terminal coupled to the second control line.

3. The RRAM device of claim 1, further comprising:
   a reading circuit, coupled to the first control line, for selectively detecting the state of the programmable resistive element, wherein the first programmable current source is coupled to the first control line and provides a third configuration current that can distinguish the state of the programmable resistive element which is lower than a reset current of the programmable resistive element.

4. The RRAM device of claim 3, wherein the third configuration current is configured at VDD/HSR, wherein VDD is an operating voltage of the RRAM device and HSR is a resistance of the programmable resistive element in a high resistance state.

5. The RRAM device of claim 3, wherein the first programmable voltage source is coupled to the first control line and provides a third configuration voltage that is lower than a set voltage of the programmable resistive element when the reading circuit detects the state of the programmable resistive element.

6. The RRAM device of claim 3, wherein the reading circuit is an inverter.

7. The RRAM device of claim 3, wherein the reading circuit comprises an inverter.

8. The RRAM device of claim 1, wherein the first programmable voltage source is a programmable voltage regulator.

9. The RRAM device of claim 1, wherein the first programmable current source is a programmable current mirror.

10. The RRAM device of claim 1, wherein the first programmable voltage source is coupled to the first control line, and the RRAM device further comprises:
    a second programmable voltage source, coupled to the second control line, for selectively providing the configuration voltage to the RRAM cell;
    wherein the first programmable current source is operably coupled to one of the first programmable voltage source and the second programmable voltage source, and the state of the programmable resistive element of the RRAM cell is configured according to the configuration current provided by the first programmable current source and the configuration voltage provided by at least one of the first programmable voltage source and the second programmable voltage source.

11. A resistive random access memory (RRAM) device, comprising:
    a first control line;
    a second control line;
    a RRAM cell, coupled between the first control line and the second control line, having a programmable resistive element;
    a programmable current source, coupled to the first control line, for selectively providing a configuration current to the RRAM cell;
    a programmable voltage source, coupled to the first control line, for selectively providing a configuration voltage to the RRAM cell; and
    a reading circuit, coupled to the first control line, for selectively reading a voltage across the programmable resistive element;
    wherein when the reading circuit reads the voltage of first control line, the configuration current is configured in a specific range that can make the reading circuit distinguish the state of the programmable resistive element.

12. The RRAM device of claim 11, wherein the configuration current is configured at VDD/HSR, wherein VDD is a logic "1" level voltage of the reading circuit and HSR is a resistance of the programmable resistive element in a high resistance state.

13. The RRAM device of claim 12, wherein when the programmable resistive element has a high resistance state, the configuration current causes the voltage of first control line to be close to a logic high level, and when the programmable resistive element has a low resistance state, the configuration current causes the voltage of first control line to be close to a logic low level.

14. A resistive random access memory (RRAM) device, comprising:
    a first control line;
    a second control line;
    a RRAM cell, coupled between the first control line and the second control line, having a programmable resistive element, wherein the programmable resistive element has a high resistance state and a low resistance state;
    a first programmable current source, for selectively providing a configuration current to the RRAM cell; and
    a first programmable voltage source, for selectively providing a configuration voltage to the RRAM cell;

wherein a state of the programmable resistive element of the RRAM cell is configured according to the configuration current and the configuration voltage; and the programmable resistive element is configured to the high resistance state by setting the configuration current to be higher than a reset current threshold of the programmable resistive element and setting the configuration voltage to be lower than a set voltage threshold.

* * * * *